(12) United States Patent
Chou

(10) Patent No.: US 6,915,844 B2
(45) Date of Patent: Jul. 12, 2005

(54) COOLING DEVICE

(75) Inventor: Ming De Chou, Taipei (TW)

(73) Assignee: Tatung Co., Ltd., Taipei (TW)

( * ) Notice: Subject to any disclaimer, the term of this patent is extended or adjusted under 35 U.S.C. 154(b) by 0 days.

(21) Appl. No.: 10/768,017

(22) Filed: Feb. 2, 2004

(65) Prior Publication Data

US 2005/0067144 A1 Mar. 31, 2005

(30) Foreign Application Priority Data

Aug. 25, 2003 (TW) ........................ 92215384 U

(51) Int. Cl.⁷ .............................................. F28D 15/00
(52) U.S. Cl. ................................. 165/104.33; 165/80.3; 165/104.21; 361/700; 257/715
(58) Field of Search ....................... 165/104.33, 104.21, 165/104.26, 185, 80.3, 80.4; 361/697, 699, 700; 257/714–716; 174/15.2

(56) References Cited

U.S. PATENT DOCUMENTS

| | | | | |
|---|---|---|---|---|
| 6,102,110 A | * | 8/2000 | Julien et al. | 165/104.33 |
| 6,321,452 B1 | * | 11/2001 | Lin | 29/890.032 |
| 6,394,175 B1 | * | 5/2002 | Chen et al. | 165/80.3 |
| 6,469,894 B2 | * | 10/2002 | Ubukata | 361/700 |
| 6,651,734 B1 | * | 11/2003 | Liu | 165/80.3 |
| 6,779,595 B1 | * | 8/2004 | Chiang | 165/104.33 |
| 6,796,373 B1 | * | 9/2004 | Li | 165/104.21 |
| 6,830,098 B1 | * | 12/2004 | Todd et al. | 165/104.33 |
| 2003/0173061 A1 | * | 9/2003 | Lai et al. | 165/80.4 |
| 2004/0035558 A1 | * | 2/2004 | Todd et al. | 165/104.26 |
| 2004/0050534 A1 | * | 3/2004 | Malone et al. | 165/80.3 |

* cited by examiner

Primary Examiner—Terrell Mckinnon
(74) Attorney, Agent, or Firm—Bacon & Thomas PLLC

(57) ABSTRACT

A cooling device is constructed to include a heat sink attached to a heat generating device and adapted to absorb heat energy from the heat generating device, and at least one heat pipe mounted in the heat sink, each heat pipe having a condensing side formed at each end and disposed at a relatively lower temperature area at the heat sink and an evaporation side formed at the middle and disposed at a relatively higher temperature area at the heat sink.

8 Claims, 5 Drawing Sheets

COOLING DEVICE

BACKGROUND OF THE INVENTION

1. Field of the Invention

The present invention relates to a cooling device and, more particularly, to such a cooling device suitable for use in a computer to dissipate heat from heat generating elements.

2. Description of Related Art

Following fast development of high technology, many products have installed therein a variety of electronic elements. The heat dissipation problem of these electronic elements bother development engineers. For example, advanced computers use microprocessors of relatively higher frequency that generate much heat during operation. ICs in a electronic system may fail if heat is not quickly dissipated during operations.

FIG. 5 is an exploded view of a cooling structure of semiconductor device according to the prior art, which shows a cooling structure adapted to dissipate heat from a semiconductor device 96. The cooling structure comprises a heat sink 91, which has a flat bottom wall disposed in close contact with the semiconductor device 96, a plurality of cooling fins 93 upwardly extended from the top surface of the flat bottom wall, two heat pipes 92 installed on the cooling fins 93, a heat-conductive cover 95 covered on the heat sink 91 over the cooling fins 93, and a fan 94 mounted on the heat-conductive cover 95.

However, generally, because the amount of heat energy generated by the semiconductor device 96 gradually decreases from the center of the semiconductor device 96 toward the border and because the end condensing sides 922 and middle evaporating sides 921 of the heat pipes 92 are respectively disposed at the top side 932 and bottom side 931 of the cooling fins 93 and maintained in close contact with the cooling fins 93, the temperature difference between the condensing sides 922 and evaporating sides 921 of the heat pipes 92 is not large enough, resulting in lower heat dissipation efficiency.

Therefore, it is desirable to provide a cooling device that improves the aforesaid problems.

SUMMARY OF THE INVENTION

It is the main object of the present invention to provide a cooling device, which has the condensing sides of each heat pipe respectively disposed at the lateral sides of the heat sink where the temperature is relatively lower, so that a significant temperature difference is produced between the condensing sides and the evaporation side of each heat pipe to improve heat dissipation efficiency.

To achieve these and other objects of the present invention, the cooling device comprises a heat sink, and at least one heat pipe. The heat sink is a substantially U-shaped device comprising a flat bottom panel, two upright side panels at two opposite lateral sides of the flat bottom panel, a plurality of cooling fins respectively upwardly extended from the flat bottom panel and arranged in parallel between the upright side panels, at least one side locating groove respectively disposed at an outer surface of each the upright side panel, and at least one bottom locating groove disposed at a bottom surface of the flat bottom panel. The at least one heat pipe is respectively having a substantially U-shaped profile and received in the at least one side locating groove and the at least one bottom locating groove of the heat sink.

After installation of the at least one heat pipe in the heat sink, the ends of each heat pipe form a respective condensing side, and the middle part of each heat pipe forms an evaporation side. Because the amount of thermal energy generated from the heat source (the semiconductor chip or the like) gradually reduces from the center area of the heat source toward the border area, the temperature at the lateral cooling fins is lower than the temperature at the middle cooling fins. Because the two condensing sides of each heat pipe are respectively disposed at the side panels where the temperature is relatively lower, there is a significant temperature between the side panels of the heat sink and the condensing sides of each heat pipe. Therefore, the invention greatly improves heat dissipation efficiency.

DETAILED DESCRIPTION OF THE PREFERRED EMBODIMENT

For easy understanding of the technical content of the present invention, the present invention will now be described by way of the following two embodiments in which the first embodiment has the heat pipes extended perpendicular to the cooling fins; the second embodiment has the heat pipes extended in parallel to the cooling fins.

Figure 1:
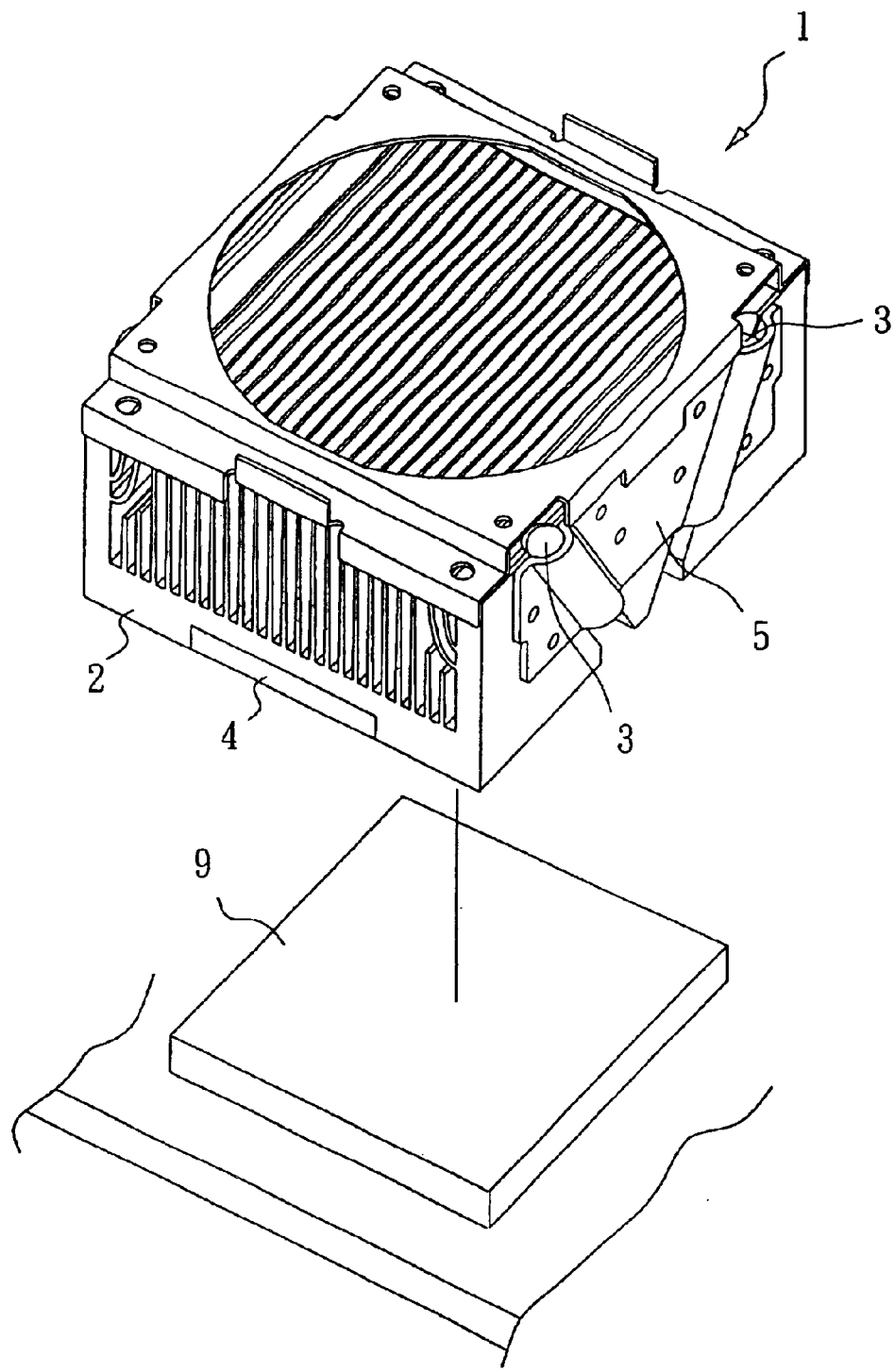
FIG. 1 is a perspective view of a cooling device according to the first embodiment of the present invention.

FIG. 1 is a perspective view showing a cooling device 1 constructed according to the first embodiment of the present invention and adapted to dissipate heat from an IC chip 9, which generates heat when operated. Under normal status, the amount of heat gradually decreases from the center area of the IC chip 9 toward the border area thereof.

Figure 2:
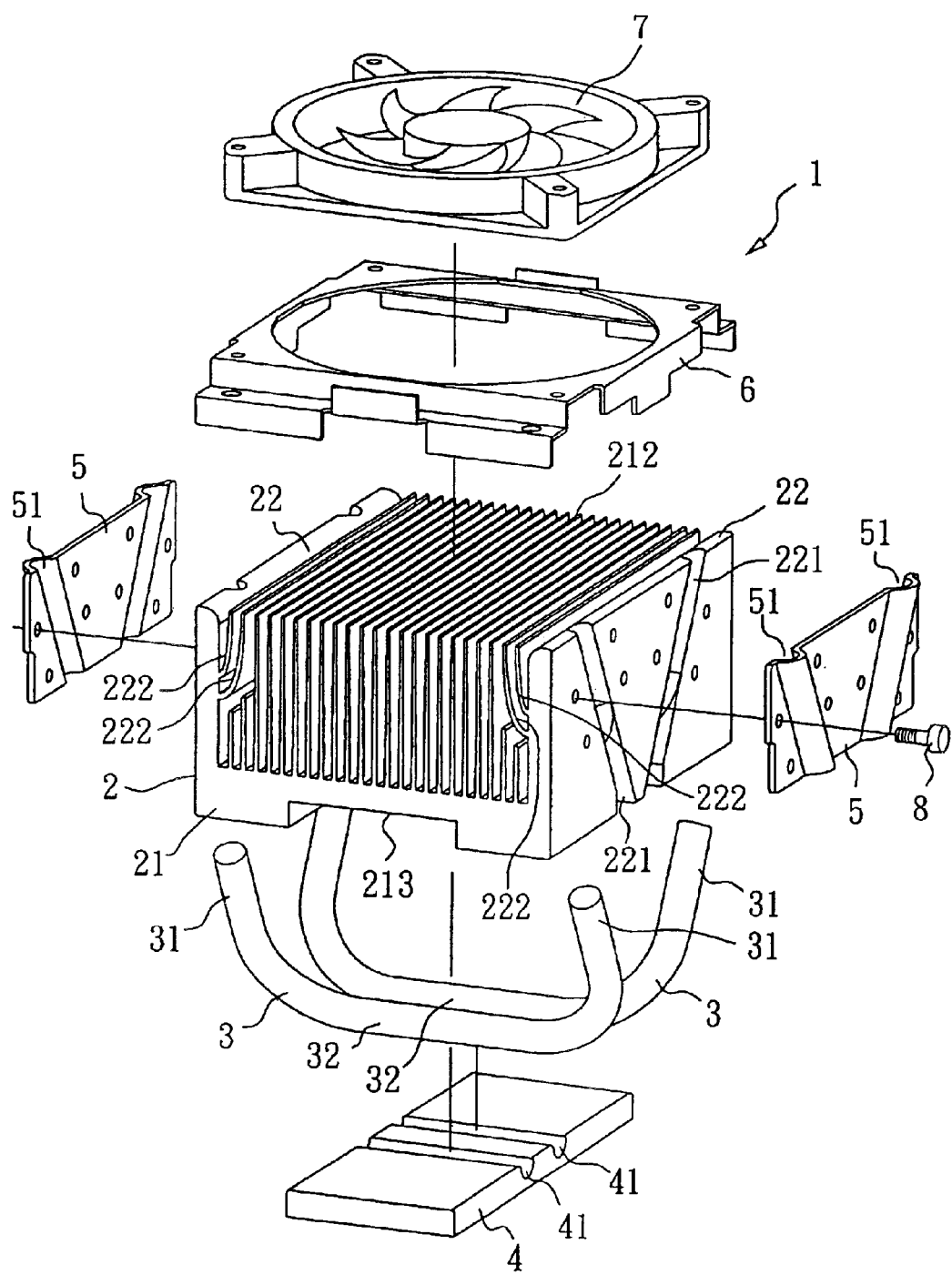
FIG. 2 is an exploded view of the cooling device according to the first embodiment of the present invention.
Figure 3:
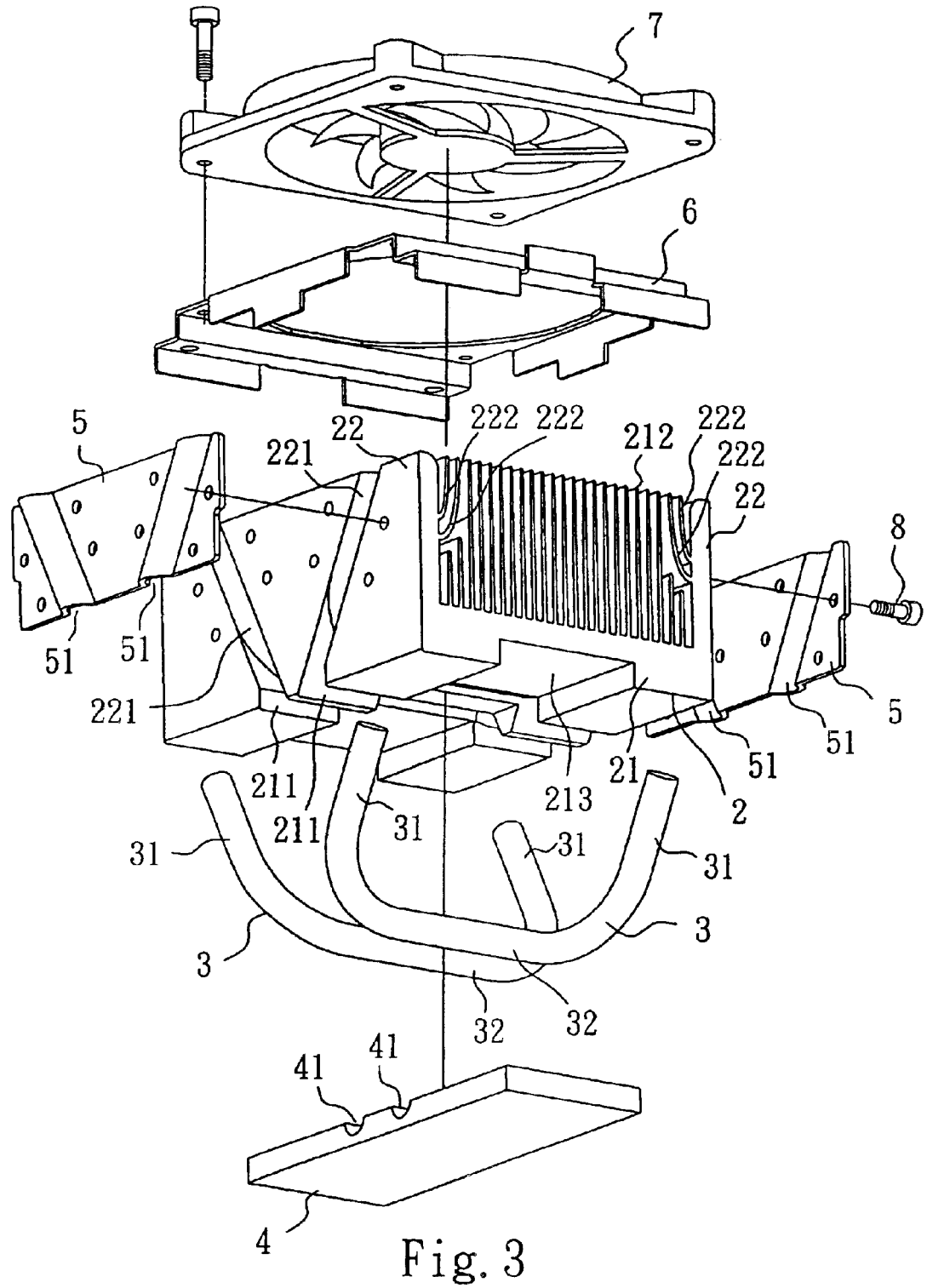
FIG. 3 is another exploded view of the cooling device according to the first embodiment of the present invention when viewed from another angle.

Referring to FIGS. 2 and 3 and FIG. 1 again, the cooling device 1 comprises a heat sink 2, and two heat pipes 3. The heat sink 2 is a substantially U-shaped aluminum member having a flat bottom panel 21, two side panels 22 respectively upwardly extended from the two opposite lateral sides of the flat bottom panel 21 and arranged in parallel, and a plurality of cooling fins 212 perpendicularly upwardly extended from the top surface of the flat bottom panel 21 and arranged in parallel between the side panels 22. The side panels 22 each have two locating grooves 221 respectively formed in the outer surface and extended from the top side to the bottom side. The bottom panel 21 has two locating grooves 211 formed in the bottom surface and respectively connected between the two corresponding opposite locating grooves 221 at the bottom sides of the outer surfaces of the two side panels 22.

The heat pipes 3 are U-tubes received in the locating grooves 211 at the bottom panel 21 and the locating grooves 221 at the side panels 22. According to this embodiment, the bottom panel 21 further has a transverse bottom recess 213 formed in the bottom surface and transversely extended across the locating grooves 211. A cooling plate 4 is set in the transverse bottom recess 213 to hold the heat pipes 3 in the locating grooves 211 at the bottom panel 21. According to this embodiment, the cooling plate 4 is a copper plate. Further, two packing plates 5 are respectively fixedly fastened to the two side panels 22 with screws 8 to hold down the heat pipes 3 in the locating grooves 221.

In order to firmly secure the heat pipes 3 to the heat sink 2, the cooling plate 4 is made having two locating grooves 41 formed in the top surface and adapted to accommodate the heat pipes 3 after the heat pipes 3 have been received in the locating grooves 211 at the bottom panel 21. Further, the packing plates 5 each have two locating grooves 51 corresponding to the locating grooves 221 at the side panels 22 for holding the heat pipes 3.

When installed in the heat sink 2, the two ends of each heat pipe 3 forms a respective condensing side 31, and the middle part of each heat pipe 3 forms an evaporation side 32. Through the cooling plate 4, the evaporation side 32 of each heat pipe 3 absorbs heat energy from the IC chip 9, and transfers absorbing heat energy to the condensing side 31 at each end of the respective heat pipe 3. At the same time, a part of heat energy is transferred from the IC chip 9 to the cooling fins 212 of the heat sink 2.

Because the center area of the IC chip 9 has the maximum amount of heat and the amount of heat is gradually reduced from the center area of the IC chip 9 toward the border area, the temperature of the cooling fins 212 near the center area of the heat sink 2 is higher than the temperature of the side panels 22. Because the condensing sides 31 at the ends of the heat pipes 3 are respectively disposed at the side panels 22 of the heat sink 2, there is a more temperature difference between the condensing sides 31 of the heat pipes 3 and the side panels 22 of the heat sink 2, achieving a better heat dissipation effect.

In order to make sure of the expected heat dissipation effect, the inventor examined the thermal resistance (R) of a cooling device constructed according to the aforesaid first embodiment to be 0.244. Conventional heat sinks for this purpose commonly have a thermal resistance over 0.3. Because a relatively lower thermal resistance achieves relatively better heat dissipation effect, the invention greatly improves heat dissipation effect.

Referring to FIGS. 2 and 3 again, the side panels 22 each further comprise a plurality of auxiliary cooling fins 222 that increase the heat cooling area of the heat sink 2. Further, a heat-conductive top cover 6 may be covered on the top side of the heat sink 2 to hold an electric fan 7, enhancing the heat dissipation effect of the cooling device.

Figure 4:
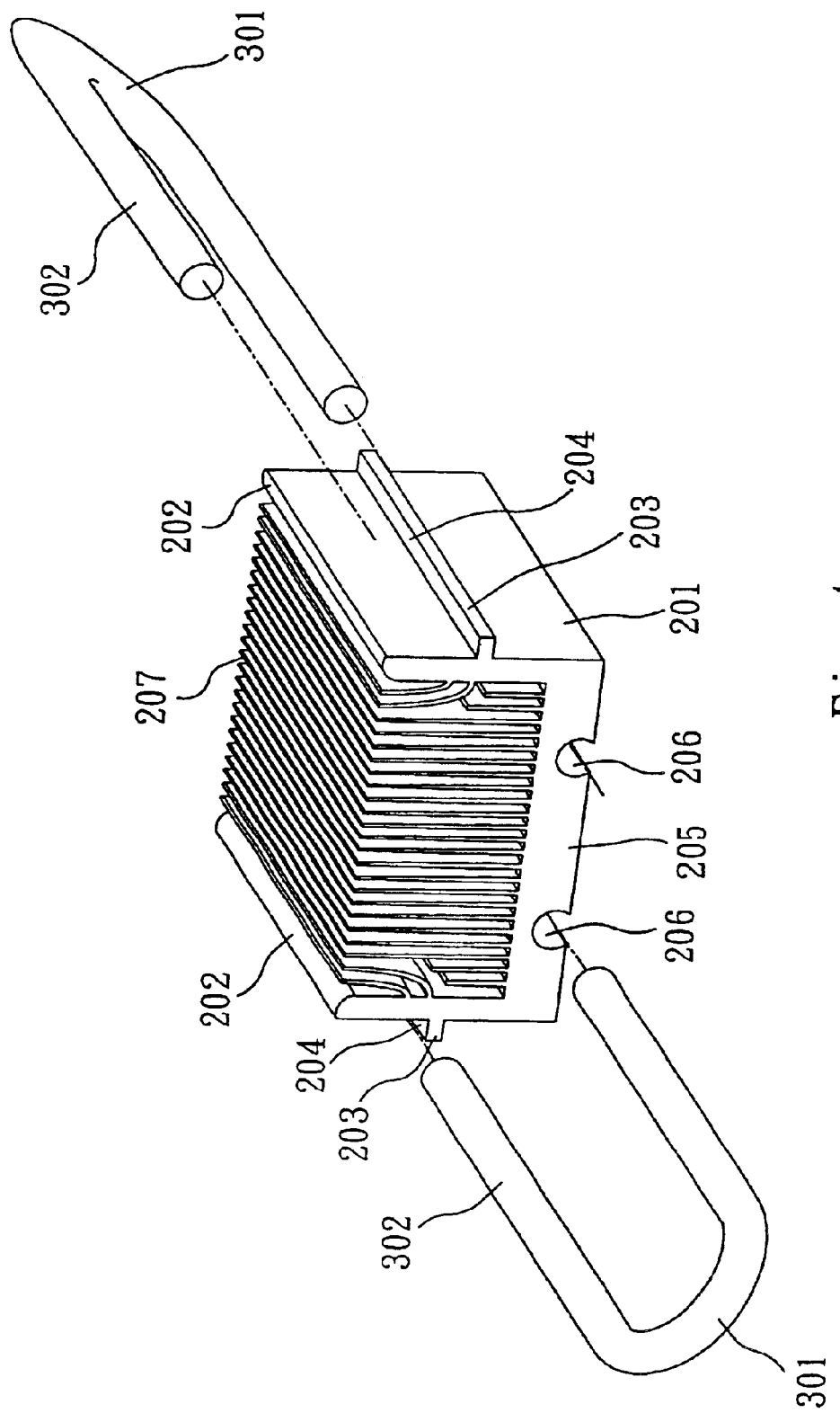
FIG. 4 is an exploded view of a cooling device according to the second embodiment of the present invention.
Figure 5:
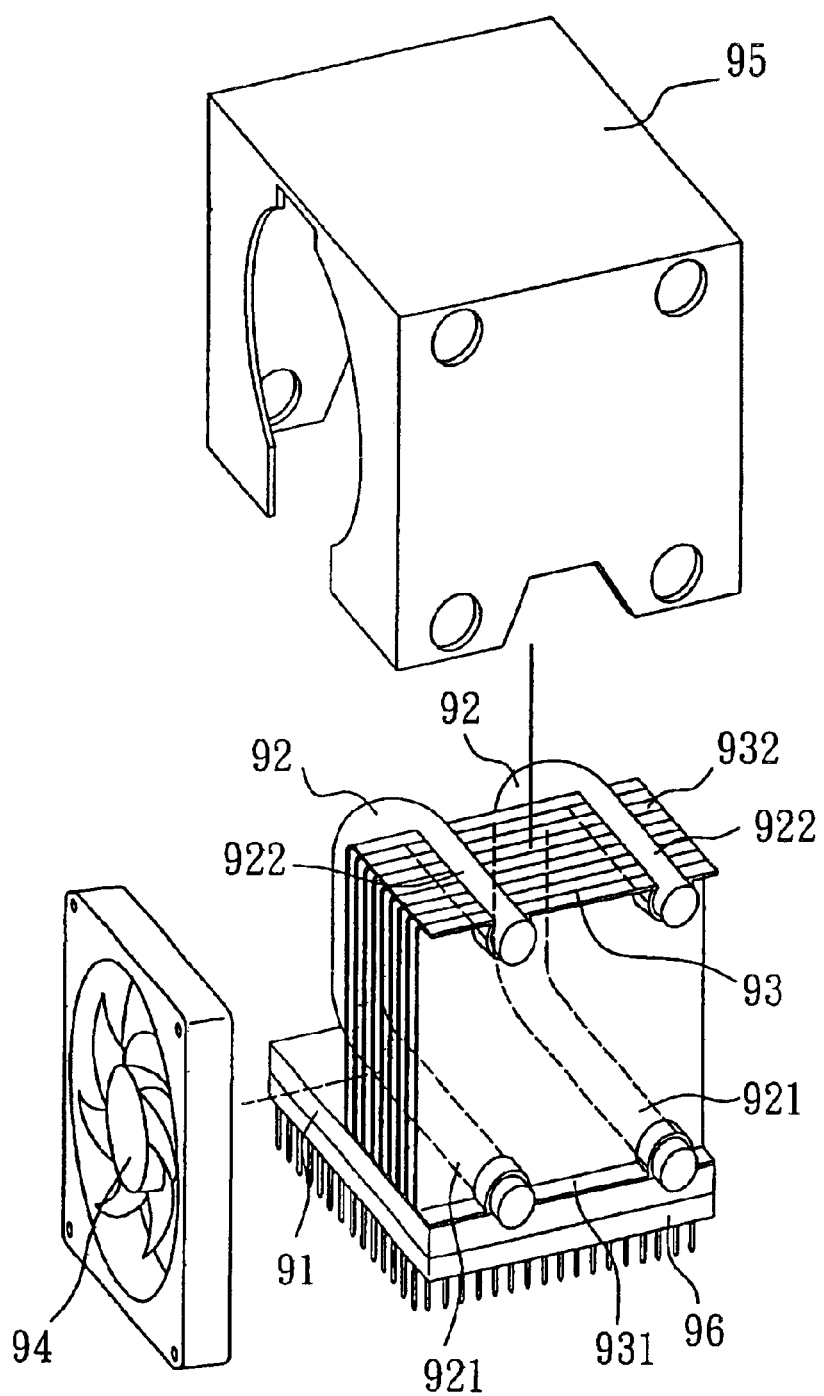
FIG. 5 is an exploded view of a semiconductor device cooling structure according to the prior art.

FIG. 4 is an exploded view of the second embodiment of the present invention. According to this embodiment, the heat pipes are disposed in parallel to the cooling fins. As illustrated, the heat sink 201 comprises a flat bottom panel 205, two upright side panels 202 at two opposite lateral sides of the flat bottom panel 205, a plurality of cooling fins 207 upwardly extended from the top surface of the flat bottom panel 205 and arranged in parallel between the upright side panels 202, two side flanges 203 respectively transversely protruded at the upright side panels 202 at the outer side, and two bottom locating grooves 206 disposed at the bottom surface of the bottom panel 205. The two side flanges 203 defining with the respective outer surface of each the side panels 202 the holding spaces 204. The heat pipes 301 are respectively fastened to the holding spaces 204 between the side panels 202 and the side flanges 203 and the bottom locating grooves 206 at the bottom panel 205. Because the condensing sides 302 of the heat pipes 301 are respectively disposed at the area having a relatively lower temperature, i.e., at the side panels 202, there is a more temperature difference between the condensing sides 302 of the heat pipes 301 and the side panels 202 of the heat sink 201. Therefore, this embodiment achieves the same effects.

In the aforesaid two embodiments, the heat pipes may be directly welded to the heat sink to achieve better heat-transfer performance. The aforesaid second embodiment is relatively simple than the aforesaid first embodiment. Further, except the heat pipes, the heat sink is preferably made by extrusion.

Although the present invention has been explained in relation to its preferred embodiment, it is to be understood that many other possible modifications and variations can be made without departing from the spirit and scope of the invention as hereinafter claimed.

What is claimed is:

1. A cooling device comprising:
   a heat sink, said heat sink having a substantially U-shaped profile, said heat sink comprising a flat bottom panel, two upright side panels at two opposite lateral sides of said flat bottom panel, a plurality of cooling fins respectively upwardly extended from said flat bottom panel and arranged in parallel between said upright side panels, at least one side locating groove respectively disposed at an outer surface of each said upright side panel, and at least one bottom locating groove disposed at a bottom surface of said flat bottom panel; and
   at least one heat pipe having a substantially U-shaped profile and respectively received in said at least one side locating groove and said at least one bottom locating groove of said heat sink.

2. The cooling device as claimed in claim 1, wherein the at least one side locating groove at the outer surface of each said upright side panel respectively extends from a top side of the respective upright side panel to a bottom side of the respective upright side panel; said at least one bottom locating groove is respectively connected between two corresponding opposite side locating grooves at the bottom sides of the outer surfaces of said two upright side panels.

3. The cooling device as claimed in claim 1, wherein said heat sink further comprises a bottom recess formed in said bottom panel and transversely extended across said at least one bottom locating groove, and a heat-conductive cooling plate fitted into said bottom recess to hold down said at least one heat pipe in said at least one bottom locating groove.

4. The cooling device as claimed in claim 3, wherein said heat-conductive cooling plate has at least one locating groove disposed in one surface thereof and adapted to accommodate said at least one heat pipe.

5. The cooling device as claimed in claim 1, further comprising two packing plates respectively fixedly fastened to the outer surfaces of said upright side panels to hold down said at least one heat pipe in the at least one side locating groove at each said upright side panel.

6. The cooling device as claimed in claim 5, wherein said packing plates each have at least one locating groove disposed at an inner surface thereof and adapted to accommodate said at least one heat pipe.

7. The cooling device as claimed in claim 1, wherein said two upright side panels each further comprise at least one auxiliary cooling fin.

8. The cooling device as claimed in claim 1, wherein said two upright side panels each have at least one side flange protruded at each said outer surfaces, said at least one side flange defining with the respective outer surface of each said upright side panel the at least one side locating groove.

* * * * *